United States Patent [19]

Ogawa et al.

[11] Patent Number: 4,529,679

[45] Date of Patent: Jul. 16, 1985

[54] PHOTOCONDUCTIVE MEMBER

[75] Inventors: Kyosuke Ogawa, Tokyo; Shigeru Shirai, Yamato; Keishi Saitoh, Tokyo; Teruo Misumi, Kawasaki; Junichiro Kanbe, Yokohama, all of Japan

[73] Assignee: Canon Kabushiki Kaisha, Tokyo, Japan

[21] Appl. No.: 564,409

[22] Filed: Dec. 22, 1983

[30] Foreign Application Priority Data

Dec. 27, 1982 [JP] Japan ................................ 57-229306

[51] Int. Cl.[3] .......................... G03G 5/02; G03G 5/08; B05D 5/00; H01L 45/00

[52] U.S. Cl. .......................................... 430/84; 357/2; 427/74; 430/57; 430/95

[58] Field of Search ............... 430/57, 84, 95; 427/74; 357/2

[56] References Cited

U.S. PATENT DOCUMENTS 4,196,438 1/1980 Carlson .................................. 357/2
4,423,133 12/1983 Kanbe et al. .......................... 430/84

FOREIGN PATENT DOCUMENTS 3046509 1/1981 Fed. Rep. of Germany ........ 430/95
11946 1/1983 Japan .................................... 430/84

*Primary Examiner*—John E. Kittle
*Assistant Examiner*—Mukund J. Shah
*Attorney, Agent, or Firm*—Fitzpatrick, Cella, Harper & Scinto

[57] ABSTRACT

A photoconductive member comprises a substrate and a light receiving layer having photoconductive provided on said support, comprising silicon atoms as a matrix and at least halogen atoms as constituent atoms said light receiving layer having a depth profile with respect to the layer thickness direction such that the concentration of halogen atoms contained therein is increased from the said substrate side toward the surface side of the photoconductive member.

24 Claims, 10 Drawing Figures

PHOTOCONDUCTIVE MEMBER

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays gamma-rays and the like].

2. Description of the Prior Art

Photoconductive materials, which constitute image forming members for electrophotography in solid state image pick-up devices or in the field of image formation, or photoconductive layers in manuscript reading devices, are required to have a high sensitivity, a high SN ratio [Photocurrent $(I_p)/(I_d)$], absorption spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, publications of German Laid-Open Patent Publication Nos. 2746967 and 2855718 disclose applications of a-Si for use in image forming members for electrophotography, and a publication of German Laid-Open Patent Publication No. 2933411 an application of a-Si for use in a photoelectric converting reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance; and further stability with lapse of time.

For instance, when applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigue by repeated uses or so called ghost phenomenon wherein residual images are formed.

Further, according to a large number of experiments by the present inventors, a-Si as the material constituting the photoconductive layer of an image forming member for electrophotography, while it has a number of advantages, as compared with inorganic photoconductive materials such as Se, CdS, ZnO and etc., or organic photoconductive materials such as PVCz TNF and etc., of prior art, is also found to have problems to be solved. Namely, when charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional electrophotographic process. Moreover, this tendency is further pronounced under a humid atmosphere to such an extent in some cases that no charge is retained at all before development treatment.

Further, a-Si materials may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

Especially, in the vicinity of the surface or at the interface between the layers adjacent to each other, the problems of behavior of the charges which will be changed variously depending on the kind of the atoms contained, their concentrations and profiles of distribution or stability of the structure become very important controlling this part is often a key for having the photoconductive member exhibit its function as desired to control to have a photoconductive member exhibit its function as desired.

Particularly, when a-Si photosensitive member is prepared by a method generally known in the art, difficulties are encountered in many cases such as repeating characteristics of images or durability thereof. While its mechanism has not been clarified so far, insufficiency with respect to repeating characteristic may be presumably the problem of the capacity of transporting charges in the vicinity of the surface or at the layer interface, and insufficiency with respect to durability may be caused by the structural change in the vicinity of the surface or at that layer interface. Accordingly, the layer design near the interface may be not improved on the basis of factors slightly different from that in the bulk portion.

SUMMARY OF THE INVENTION

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution of photoconductive layer which is constituted of so called halogenated amorphous silicon, or halogen-containing hydrogenated amorphous silicon which is an amorphous material containing silicon atoms as a matrix, and halogen atom (X) and hydrogen atom (H), if desired [hereinafter referred to comprehensively as a-Si(H, X)], said photoconductive member being prepared by designing so as to have a specific structure as hereinafter described, is found to exhibit not only practically extremely excellent characteristics but also surpass the photoconductive members of the prior art in substantially all respects, especially having markedly excellent characteristics as a photoconductive member for electrophotography.

An object of the present invention is to provide a photoconductive member having electrical, optical and photoconductive characteristics which are constantly stable and all-environment type with virtually no dependence on the environments under use, which member is markedly excellent in light fatigue resistance and also excellent in durability without causing deterioration phenomenon when used repeatedly, exhibiting no or substantially no residual potential observed.

Another object of the present invention is to provide a photoconductive member having excellent electrophotographic characteristics, which is sufficiently capable of retaining charges at the time of charging treatment for formation of electrostatic charges to the extent such that a conventional electrophotographic method can be very effectively applied when it is provided for use as an image forming member for electrophotography.

Another object of the present invention is to provide a photoconductive member for electrophotography capable of providing easily a high quality image which is high in density, clear in halftone and high in resolution.

Further object of the present invention is to provide a photoconductive member having high photosensitivity, high SN ratio characteristic and good electrical contact between the laminated layers.

According to the present invention, there is provided a photoconductive member comprising a substrate and a light receiving layer having photoconductivity provided on said support and comprising silicon atoms as a matrix and at least halogen atoms as constituent atoms said light receiving layer having a depth profile with respect to the layer thickness direction such that the concentration of halogen atoms contained therein is increased from said substrate side toward the surface side of the photoconductive member

DETAILED DESCRIPTION OF THE PREFERRED EMBODIMENTS

Figure 1:
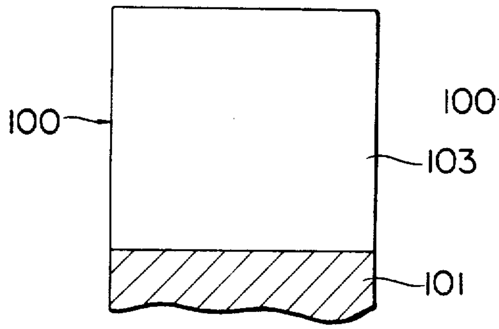
FIG. 1, FIG. 2 and FIG. 4 each shows a schematic sectional view for illustration of the layer constitution of the photoconductive member according to the present invention.

Referring now to the drawings, the photoconductive members according to the present invention are to be described in detail below.

Figure 2:
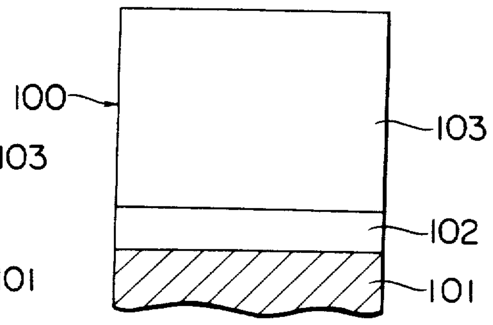

FIGS. 1 and 2 show schematic sectional views for illustration of the layer structure of a preferred embodiment of the constitution of the photoconductive member of this invention.

Figure 3A:
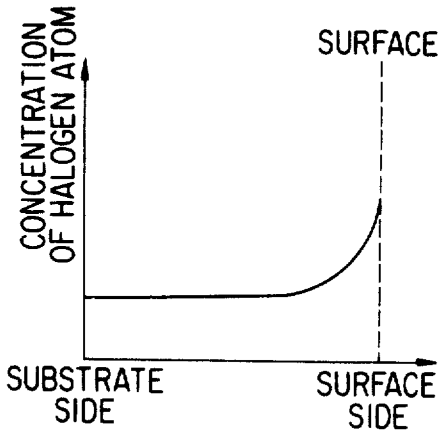
FIGS. 3A and 3B each shows a schematic illustration of the halogen atom depth profile in the light receiving layer of the photoconductive member of the present invention.

The photoconductive member 100 as shown in FIG. 1 is constituted of a light receiving layer 103 composed mainly of a-SiX(H) having photoconductivity formed on a substrate 101 for photoconductive member, or on the substrate through a lower layer 102 as shown in FIG. 2. The halogen atoms contained in the light receiving layer 103 take a depth profile which is uniform in the direction parallel to the substrate surface, but increased in its concentration from the substrate side toward the outer surface side with respect to the thickness direction of said layer, as typically shown in FIG. 3A.

Figure 3B:
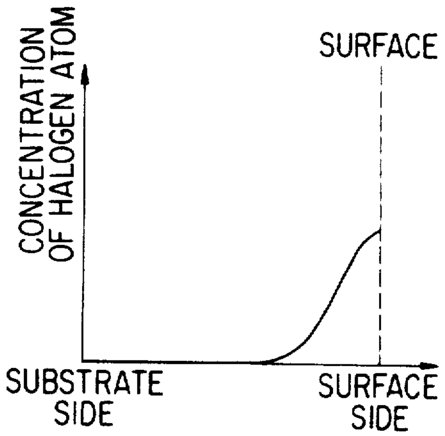

The halogen atoms contained in the light receiving layer 103 are required as described above to be greater in concentration in said layer on the surface side than those in the inner portion thereof, and the concentration of halogen atoms in the light receiving layer from the substrate side to the inner portion may be zero, as shown in FIG. 3B. On the other hand, the portion having the maximum halogen concentration in said layer may be only one part of the surface or may also have a certain range in the direction of the layer thickness. Further, as for increase in halogen atom concentration toward the surface, it may be changed either continuously or stepwise to give no essential difference, and it is a matter of suitable choice depending on the balance between the function required for the image forming member and installations for production of the photoconductive member whether what kind of depth profile should be provided.

The reason why the photoconductive member of the present invention having a light receiving layer formed so that the halogen concentration is thus increased toward the outer surface is extremely excellent in repeating characteristics of image and durability when used as a photosensitive member for electrophotography may be speculated to be based on the structure of the light receiving layer, which is increased in concentration of halogen atoms so as to be difficultly cleaved from silicon atoms and stable even at relatively higher temperatures in the vicinity of the surface of the substrate most susceptible to structural changes in the light receiving layer during manufacturing and using.

The halogen atom (X) to be contained in the light receiving layer in the present invention may include fluorine, chlorine, bromine and iodine as suitable ones, particularly preferably chlorine and above all fluorine. Of course, hydrogen atom (H) may also be contained in said layer.

The concentration of halogen atoms in the light receiving layer 103 may preferably be 0.01 to 40 atomic %, more preferably 0.5 to 30 atomic %, most preferably 1 to 10 atomic % at its maximum concentration portion, namely on the outer surface side of said layer.

As the components other than silicon atoms, hydrogen atoms and halogen atoms contained in the light receiving layer 103, there may be contained the group III atoms of the periodic table such as boron, gallium, etc., the group V atoms such as nitrogen, phosphorus, arsenic etc. as the components for controlling the width of the forbidden band or Fermi level, and further oxygen atoms, carbon atoms, germanium atoms and others, either individually or in a suitable combination thereof.

The lower layer 102 is provided for the purpose of improving adhesion between the light receiving layer and the substrate or controlling the capability of receiving charges, and it can be formed as a monolayer or a multi-layer of amorphous, microcrystalline or polycrystalline material [hereinafter referred to as a-Si(H, X), micro-Si(H, X) and poly-Si(H, X), respectively] containing an a-SiX(H) or silicon atoms as a matrix containing the group III atoms, the group V atoms of the periodic table, oxygen atoms, carbon atoms, germanium atoms, etc. depending on the purpose, and at least one of hydrogen atoms or halogen atoms.

Figure 4:
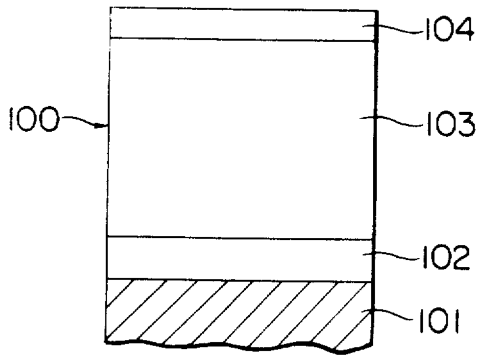

Also, as shown in FIG. 4, it is possible to provide an upper layer as the preventive layer for charge injection or the protective layer on the light receiving layer 103, and wherein said upper layer comprising an amorphous silicon containing a large amount of carbon atoms, nitrogen atoms, oxygen atoms, etc. or comprising an organic substance with high electric resistance.

The substrate to be used in the present invention may be either electroconductive or dielectric. As the electroconductive members, there may be mentioned metals such as NiCr, stainless steel, Al, Cr, Mo, Au, Nb, Ta, V, Ti, Pt, Pd etc. or alloys thereof.

As dielectric supports, there may conventionally be used films or sheets of synthetic resins such as polyester, polyethylene, polycarbonate, cellulose acetate, polypropylene, polyvinyl chloride, polyvinylidene chloride, polystyrene, polyamide, etc., glasses, ceramics, papers and so on. These dielectric supports should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, $In_2O_3$, $SnO_2$ ITO ($In_2O_3+SnO_2$) and the like thereon. Alternatively, a synthetic resin film such as polyester film can be subjected to the electroconductive treatment on its surface by vacuum vapor deposition, electronbeam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface.

The substrate may be shaped in any for which may be determined as desired. For example, when the photoconductive member 100 in FIG. 1 is to be used as an image forming member for electrophotography, it may desirably be formed into an endless belt or a cylinder for use in continuous high speed copying. The substrate may have a thickness, which is conveniently determined so that a photoconductive member as desired may be formed. When the photoconductive member is required to have a flexibility, the substrate is made as thin as possible, so far as the function of a substrate can be well exhibited. However, in such a case, the thickness is preferably 10 μm or more from the points of fabrication and handling of the substrate as well as its mechanical strength.

In the present invention, formation of a light receiving layer constituted of a-SiX(H) may be conducted according to the vacuum deposition method utilizing discharging phenomenon, such as glow discharge method, sputtering method or ion-plating method. For example, for formation of the light receiving layer constituted of a-SiX(H) according to the glow discharge method, the basic procedure comprises introducing a starting gas for Si supply capable of supplying silicon atoms (Si) together with a starting gas for introduction of halogen atoms (X) and, if desired, hydrogen atoms (H) into the deposition chamber which can be internally brought to a reduced pressure, and exciting glow discharge in said deposition chamber, thereby forming a layer comprising a-SiX(H) on the surface of a substrate set at a predetermined position. Alternatively, for formation according to the sputtering method, a gas for introduction of halogen atoms (X) and, if desired, hydrogen atoms (H) may be introduced into the deposition chamber for sputtering when sputtering a target constituted of Si in an atmosphere of an inert gas such as Ar, He or a gas mixture based on these gases.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

Effective starting gases for introduction of halogen atoms to be used in the present invention may include a large number of halogen compounds, as exemplified by halogen gases, halides, interhalogen compounds, or gaseous or gasifiable halogen compounds such as silane derivatives substituted with halogens. Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogen atoms, there may preferably be employed silicon halides such as $SiF_4$, $Si_2F_6$, $SiCl_4$, $SiBr_4$ and the like.

Introduction of hydrogen atoms into the light receiving layer in the present invention may be practiced by supplying gas primarily of $H_2$ or hydrogenated silicon such as $SiH_4$, $Si_2H_6$, $Si_3H_8$, $Si_4H_{10}$, etc. into a deposition chamber and exciting discharging therein.

When the light receiving layer containing halogen atoms is to be formed according to the glow discharge method, the basic procedure comprises introducing a hydrogenated silicon gas as the starting gas for Si supply and a gas for introduction of halogen atoms as mentioned above or a gas of the silicon compound containing halogen atoms and a gas such as Ar, $H_2$, He, etc. at a predetermined mixing ratio and gas flow rates into a deposition chamber for formation of the light receiving layer and exciting glow discharging therein to form a plasma atmosphere of these gases, whereby the light receiving layer can be formed on a desired substrate. The respective gases are not limited to the above combinations, and they may be used not only as single species but as a mixture of plural species at desired ratios.

For formation of the light receiving layer comprising a-SiX(H) according to the reactive sputtering method or the ion plating method, for example, in the case of the sputtering method, a target comprising Si may be used and sputtering of this target is effected in a certain gas plasma atmosphere. Alternatively, in the case of the ion plating method, a polycrystalline silicon or monocrystalline silicone is placed as the vaporizing source in a vapor deposition boat, and the vaporizing source is vaporized by heating according to the resistance heating method or the electron beam method (EB method)

to be permitted to boil off and pass through a certain gas plasma atmosphere.

In either of the sputtering method and the ion plating method, introduction of halogen atoms into the layer formed may be effected by introducing a gas of the aforesaid halide compound or silicon compound containing halogen compound into the deposition chamber for sputtering and forming a plasma atmosphere of said gas.

Also, for introduction of hydrogen atom together with halogen atoms, a starting gas for introduction of hydrogen atoms, for example, $H_2$ or silanes as mentioned above may be introduced into the deposition chamber and a plasma atmosphere of said gas may be formed therein.

As the starting gas for introduction of halogen atoms into the photoreceiving layer, the halogen compounds or silicon compounds containing halogens as mentioned above can effectively be used. In addition, it is also possible to use a gaseous or gasifiable substance such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like, as an effective starting material for formation of the light receiving layer.

These halides containing hydrogen atoms which can introduce hydrogen atoms as an effective constituent for controlling electrical or photoelectric characteristics of the layer during formation of the light receiving layer may introduce hydrogen simultaneously with introduction of halogen atoms, therefore, these halides can preferably be used in the present invention as the starting material for introduction of halogen atoms.

On the other hand, in the case of, for example, the reactive sputtering method, Si target may be used and $H_2$ gas, optionally together with a gas for introduction of halogen atoms, and also inclusive of inert gases such as He or Ar, introduce into the deposition chamber to form a plasma atmosphere, in which the aforesaid Si target is subjected to sputtering, whereby the light receiving layer comprising a-SiX(H) can be formed on the substrate.

Further, gases such as of $B_2H_6$ may also be introduced, in order to effect doping with impurities at the same time.

For controlling the amounts of halogen atoms (X) contained in the light receiving layer and hydrogen atoms (H) optionally added, for example, one kind or more of the substrate temperature, the amounts of the starting materials for incorporation of halogen atoms (X) or hydrogen atoms (H) to be introduced into the deposition device system, the discharging power and the like may be controlled.

For providing a layer region containing additive atoms other than silicon atoms, halogen atoms and hydrogen atoms in the light receiving layer and the lower layer, the starting material for introduction of such additive atoms may be used together with the above-mentioned starting material for formation of the light receiving layer during formation of a light receiving layer according to the glow discharge method or the reactive sputtering method, while controlling the amount added into the layer formed.

When the glow discharge method is employed for formation of the layer containing additive atoms constituting the light receiving layer, the starting materials for the starting gases for formation of said layer region may be formed by adding a starting material for introduction of additive atoms to the material selected suitably from the starting materials for formation of light receiving layer as mentioned above. As such a starting material for introduction of additive atoms, it is possible to use most of gaseous or gasified gasifiable substances containing at least additive atoms as constituent atoms.

As the starting material for introduction of additive atoms to be effectively used in the present invention, there may be mentioned $B_2H_6$, $B_4H_{10}$, $B_5H_9$, $B_5H_{11}$, $B_6H_{10}$, $GaCl_3$, $AlCl_3$, $BF_3$, $BCl_3$, $BBr_3$, $BI_3$ and the like as the material for introduction of the group III atoms of the periodic table; $PH_3$, $P_2H_4$, $AsH_3$, $SbH_3$, $BiH_3$ etc. as the material for introduction of the group V atoms; NO, $N_2O$, $O_2$, etc. as the material for introduction of oxygen atoms; $CH_4$, $C_2H_4$, $C_3H_8$, $C_4H_{10}$, etc as the material for introduction of carbon atoms; and $NH_3$, $N_2$, $N_2H_4$, $NF_3$, etc. as the primary ones.

In the present invention, as the diluting gas to be used in formation of the light receiving layer according to the glow discharge method or the sputtering method, so called rare gases, such as He, Ne, Ar, etc. may be preferably used.

Next, an example of the process for producing the photoconductive member of this invention according to the glow discharge decomposition method or the sputtering method is to be described.

Figure 5:
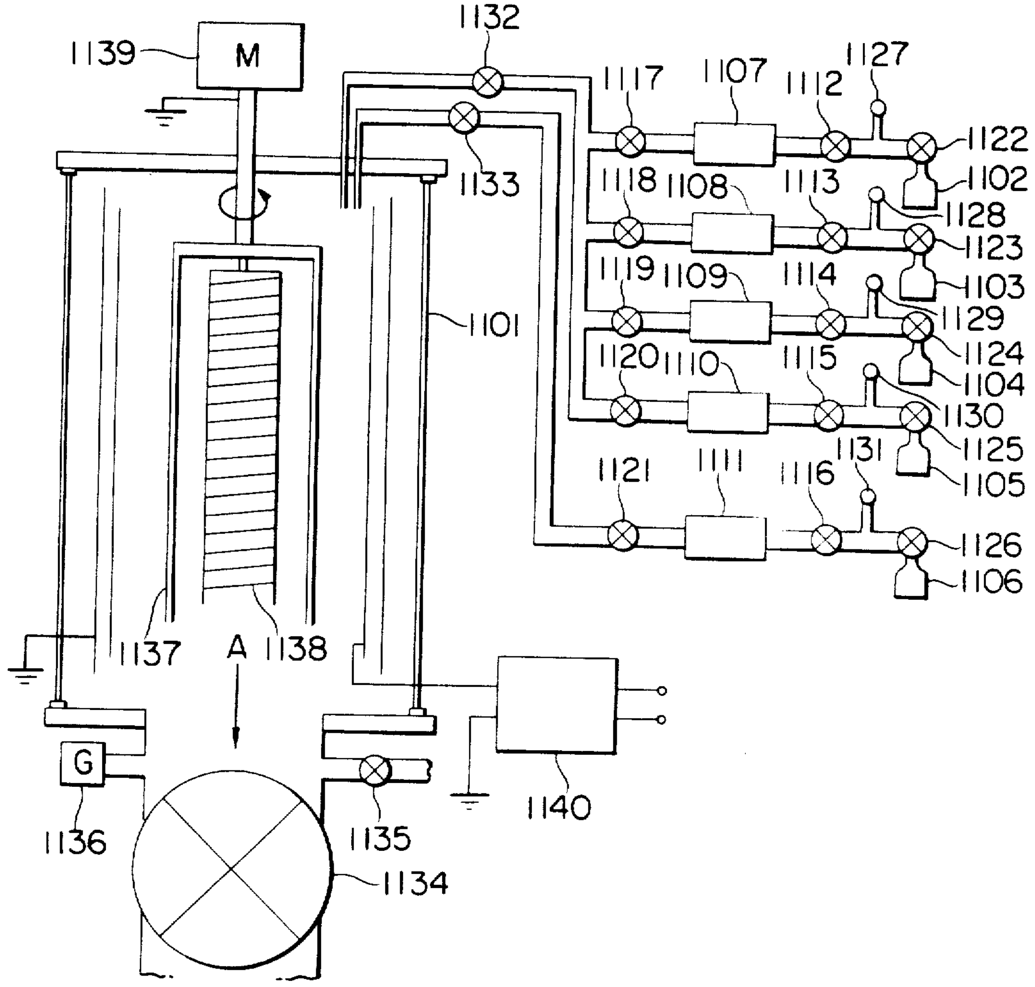
FIG. 5 is a drawing showing a device for preparation of the photoconductive member according to the glow discharge decomposition method.

FIG. 5 shows a device for producing a photocontructive member.

In the gas bombs 1102, 1103 and 1104, there are hermetically contained starting gases for formation of the photoconductive member of the present invention. For example, 1102 is a bomb containing $SiH_4$ (purity: 99.99%), 1103 is a bomb containing $B_2H_6$ gas diluted with $H_2$ (purity: 99.99%, hereinafter abbreviated as "$B_2H_6$/He"), 1104 is a NO gas bomb (purity: 99.99%), 1105 is a $CH_4$ gas bomb (purity: 99.99%) and 1106 is a $SiF_4$ gas bomb (purity: 99.99%). Other than these, although not shown in the drawing, it is also possible to provide additional bombs of desired gas species, if necessary.

For allowing these gases to flow into the reaction chamber 1101, on confirmation of the valves 1122–1125 of the gas bombs 1102–1105 and the leak valve 1135 to be closed, and the inflow valves 1112–1115, the outflow valves 1117–1120 and the auxiliary valve 1132 to be opened, the main valve 1134 is first opened to evacuate the reaction chamber 1101 and the gas pipelines. As the next step, when the reading on the vacuum gauge 1136 becomes $5\times10^{-6}$ Torr, the auxiliary valve 1132 and the outflow valves 1117–1120 are closed.

Referring now to an example of forming a light receiving layer on the cylindrical substrate 1137, $SiH_4$ gas from the gas bomb 1102, $SiF_4$ gas from the gas bomb 1106 are permitted to flow into the mass-flow controllers 1107 and 1111, respectively, firstly by controlling the pressures at the outlet pressure gauges 1127, 1131 to 1 Kg/cm$^2$, respectively, and then by opening the valves 1122 and 1126 and opening gradually inflow valves 1112 and 1116. Subsequently, the outflow valves 1117, 1121 and the auxiliary valve 1132 are gradually opened to permit respective gases to flow into the reaction chamber 1101. The outflow valves 1117, 1121 are controlled so that the flow rate ratio of $SiH_4$ gas and $SiF_4$ gas may have a desired value and opening of the main valve 1134 is also controlled while watching the reading on the vacuum gauge 1136 so that the pressure in the reaction chamber may reach a desired value. And, after confirming that the temperature of the substrate cylinder 1137 is set at 50°–400° C. by the heater 1138, the power source 1140 is set at a desired power to excite glow discharge in the reaction chamber 1101. At the same time, the concentration of halogen atoms in the layer formed is controlled by carrying out the operation to change gradually the valves 1117, 1121 for changing the flow rate ratio of $SiH_4$ and $SiF_4$ gases according to a change rate curve previously designed by manual operation or by means of an externally driven motor.

As the next step, sometimes further formation of the upper layer thereon is conducted. This operation is basically the same as described above. The outflow valves other than those for the gases necessary for formation of respective layers are of course all closed, and for avoiding remaining of gases used in the preceding layer in the reaction chamber 1101 and in the pipelines from the inflow valves 1117 to 1120 to the reaction chamber 1101, the operation to close the outflow valves 1117 to 1120, with opening of the auxiliary valve 1132 and full opening of the main valve 1134, thereby evacuating once the system to high vacuum, may be conducted if desired.

In the above case, control of the halogen atom concentration has been practiced by controlling the flow rates of the starting gases, but such a control may also be practiced by controlling the discharging power or the substrate temperature, or by combination of these.

During the layer formation, the substrate cylinder 1137 may be rotated at a constant speed by means of the motor 1139 in order to make layer formation uniform.

The present invention is illustrated in detail according to the examples.

EXAMPLE 1

Figure 6:
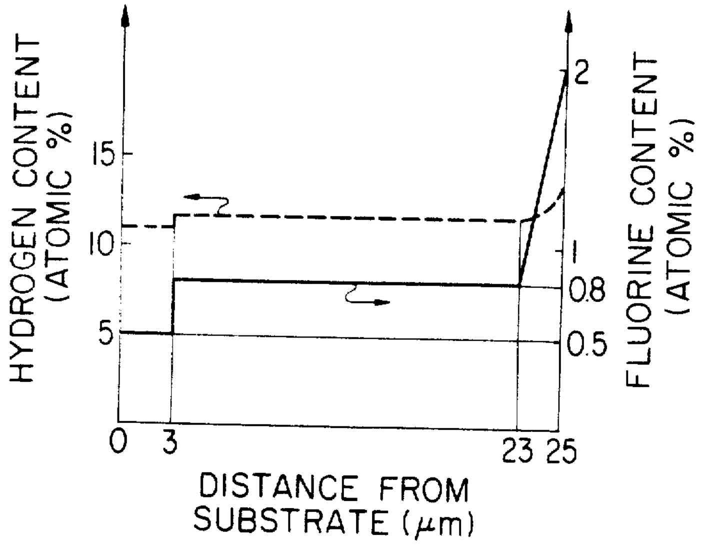
FIGS. 6 through 8 are charts showing the analytical results of the halogen atom depth profile in the photoconductive member according to working Examples of the present invention.

By using the device for preparation of photo-conductive member as shown in FIG. 5, a light receiving layer was formed according to the preparation conditions as shown in Table 1 on an aluminum cylinder according to the glow discharge method as described in detail above. A part of the drum obtained was cut and the concentrations of fluorine atoms and hydrogen atoms were quantitatively determined by means of a secondary ion mass spectroscopy (SIMS) to obtain the results of depth profiles as shown in FIG. 6. The remainder of the photosensitive drum was also set on an electrophotographic device for image evaluation. Image evaluation was conducted by effecting image formations under ordinary environment in total number of 200,000 sheets, and superiority and inferiority were judged with respect to density, resolution, gradation reproducibility and image defect for respective images of every 10,000 sheets. As the result, it was confirmed that every group of samples had images of very high quality. Next, this photosensitive drum was heated at 300° C. in an electric furnace for 2 hours, and again set on the same electrophotographic device to effect image formation. No change was observed at all. Further, this photosensitive drum was placed in an exposure box equipped with halogen lamps on the wall surface capable of effecting uniformly light irradiation on the photosensitive drum, and light irradiation corresponding to 200 $mW/cm^2$ was conducted continuously for 24 hours. After cooling, image formation was effected again, and also in this case no change was observed at all.

From the above experiments, it was confirmed that this photosensitive drum had sufficient durability under by far severer conditions than practical use environment, thus providing that the behaviors of the constituent atoms relatively sensitive to the external environment within the light receiving layer could be improved without occurrence of side effects by increasing the concentration of halogen atoms especially on the surface of the light receiving layer where the changes of such behaviors most readily appear.

EXAMPLES 2 AND 3

Figure 7:
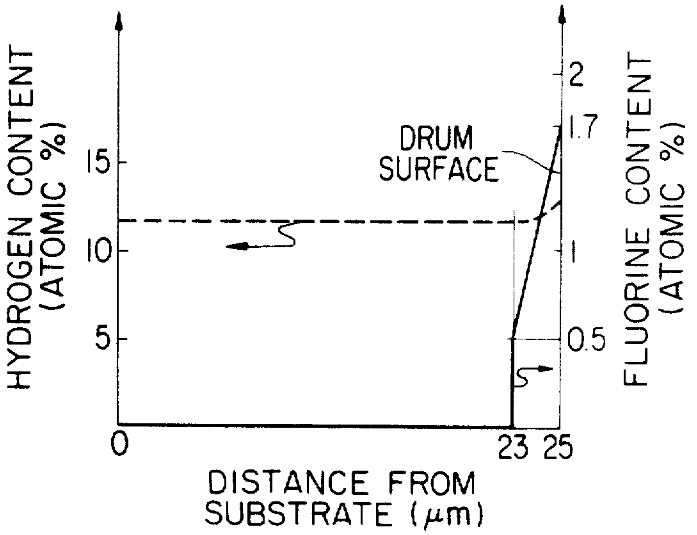
Figure 8:
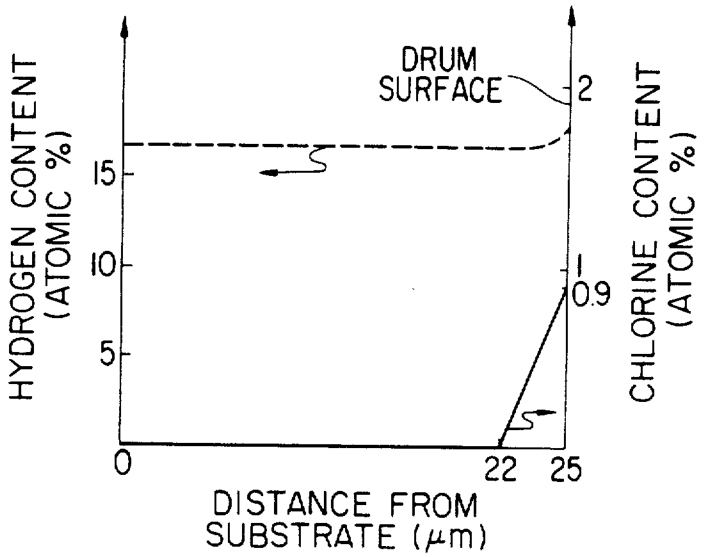

A photosensitive drum was prepared in the same manner as in Example 1 except that the depth profile of halogen atoms was changed. Details of the preparation conditions are shown in Tables 2 and 3. Analysis of constituent atoms concentrations, image evaluation and durability tests were conducted for this photosensitive drum in the same manner as described in Example 1. As the result, the depth profiles of halogen atoms and hydrogen atoms as shown in FIG. 7 and FIG. 8 were obtained. As for image evaluation and durability tests, good results comparable to Example 1 were obtained.

EXAMPLES 4 AND 5

On the deposited film according to the same procedure as described in Example 1, upper layers were formed under the preparation conditions as shown in Tables 4 and 5, continuously while maintaining vacuum. As the result of image evaluation and durability test conducted similarly as in Example 1, it was found that high level of quality could be maintained without any deleterious effect on image quality.

COMPARATIVE EXAMPLE 1

Figure 9:
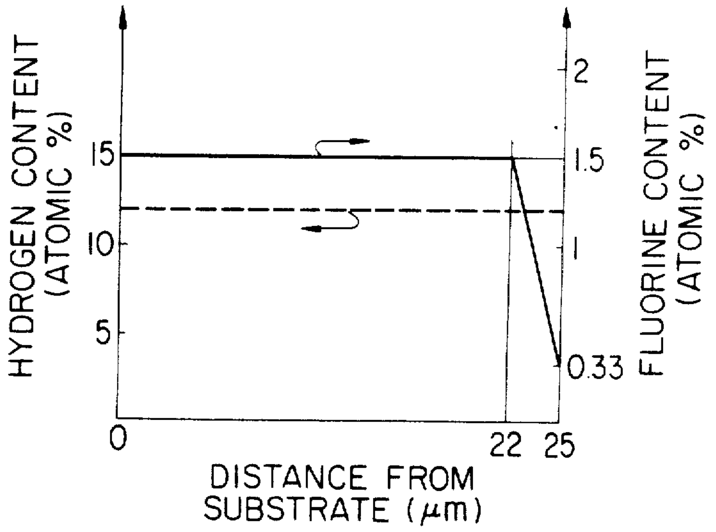
FIG. 9 is a chart showing the analytical result of the halogen atom depth profile in the photoconductive member according to a Comparative Example of the present invention.

Example 1 was repeated to prepare a photosensitive drum except that the depth profile of halogen atoms was changed so as to be decreased the content of halogen atoms in the part of the outer surface of the light receiving layer as shown in FIG. 9. Using this photosensitive drum, the same evaluation was conducted in the same manner as in Example 1. As the result, initial images and images by a copying device under altered environment were comparable to Example 1, but potential lowering and increased image defects were observed under either after high temperature annealing or light irradiation, thus providing only materials which were uncertain in durability when put to use of a practical number of copying on the order of 1,000,000 sheets.

TABLE 1

| | Conditions | | | |
|---|---|---|---|---|
| Order of lamination | Starting gases | Flow rate of gases (SCCM) | Discharging power (W) | Deposition time (min.) |
| 1 | $SiF_4$ | 150 | 200 | 10 |
| | $SiH_4$ | 150 | | |
| | $B_2H_6/H_2$ | 300 | | |
| | NO | 3 | | |
| 2 | $SiF_4$ | 150 | 200 | 250 |
| | $SiH_4$ | 150 | | |
| | Ar | 150 | | |
| | $SiF_4$ | 150-250 | | |
| 3 | $SiH_4$ | 150 | 200 | 30 |
| | Ar | 150 | | |
| | $H_2$ | 0→100 | | |

TABLE 2

| | Conditions | | | |
|---|---|---|---|---|
| order of lamination | Starting gases | Flow rate of gases (SCCM) | Discharging power (W) | Deposition time (min.) |
| 1 | $SiH_4$ | 300 | 250 | 6 |
| | $B_2H_6/H_2$ | 300 | | |
| | NO | 9 | | |
| 2 | $SiH_4$ | 300 | 250 | 170 |
| 3 | $SiH_4$ | 300 | 250 | 20 |
| | $SiF_4$ | 300 | | |
| | Ar | 0→1000 | | |

TABLE 3

| | Conditions | | | |
|---|---|---|---|---|
| order of lamination | Starting gases | Flow rate of gases (SCCM) | Discharging power (W) | Deposition time (min.) |
| 1 | $SiH_4$ | 200 | 250 | 260 |
| | He | 400 | | |
| | NO | 2.6 | | |
| | $B_2H_6/H_2$ | 5.3 | | |
| 2 | $SiH_4$ | 100→200 | 250 | 30 |
| | $SiCl_4$ | 0→400 | | |
| | NO | 2.6→0 | | |
| | $B_2H_6/H_2$ | 5.3 | | |

TABLE 4

| | Conditions | | | |
|---|---|---|---|---|
| Order of lamination | Starting gases | Flow rate of gases (SCCM) | Discharging power (W) | Deposition time (min.) |
| Upper layer | $SiH_4$ | 10 | 250 | 6.5 |
| | $CH_4$ | 300 | | |

TABLE 5

| | Conditions | | | |
|---|---|---|---|---|
| Order of lamination | Starting gases | Flow rate of gases (SCCM) | Discharging power (W) | Deposition time (min.) |
| Upper layer | $SiH_4$ | 10 | 250 | 6.5 |
| | $CH_4$ | 300 | | |
| | $CF_4$ | 30 | | |

What we claim is:

1. A photoconductive member comprising a substrate and a light receiving layer having photoconductivity provided on said support and comprising silicon atoms as a matrix and at least halogen atoms as constituent atoms, said light receiving layer having a depth profile with respect to the layer thickness direction such that the concentration of halogen atoms contained therein is increased from said substrate side toward the surface side of the photoconductive member.

2. A photoconductive member according to claim 1, wherein the concentration of halogen atoms in the light receiving layer is zero from the substrate side to the central portion thereof.

3. A photoconductive member according to claim 1, wherein the portion having the maximum halogen atom concentration in the light receiving layer is a single spot of the surface.

4. A photoconductive member according to claim 1, wherein the portion having the maximum halogen atom concentration in the light receiving layer has a range.

5. A photoconductive member according to claim 1, wherein the halogen atom concentration in the light receiving layer is increased continuously.

6. A photoconductive member according to claim 1, wherein the halogen atom concentration in the light receiving layer is increased stepwise.

7. A photoconductive member according to claim 1, wherein hydrogen atoms are contained in the light receiving layer.

8. A photoconductive member according to claim 1, wherein the concentration of halogen atoms in the light receiving layer is within the range of 0.01 to 40 atomic % at the maximum portion thereof.

9. A photoconductive member according to claim 1, wherein the atoms of the group III of the periodic table are contained in the light receiving layer.

10. A photoconductive member according to claim 1, wherein the atoms of the group V of the periodic table are contained in the light receiving layer.

11. A photoconductive member according to claim 1, wherein both the hydrogen atoms and the atoms of the group III of the periodic table are contained in the light receiving layer.

12. A photoconductive member according to claim 1, wherein both the hydrogen atoms and the atoms of the group V of the periodic table are contained in the light receiving layer.

13. A photoconductive member according to claim 1, wherein at least one of oxygen atoms, carbon atoms and germanium atoms are contained in the light receiving layer.

14. A photoconductive member according to claim 7, wherein either the group III atoms or the group V atoms of the periodic table is further contained in the light receiving layer.

15. A photoconductive member according to claim 14, wherein at least one of oxygen atoms, carbom atoms and germanium atoms are contained in the light receiving layer.

16. A photoconductive member according to claim 1, wherein a lower layer comprising an amorphous, microcrystalline or polycrystalline material comprising silicon atoms as a matrix and at least one of hydrogen atoms and halogen atoms is further provided between the substrate and the light receiving layer.

17. A photoconductive member according to claim 16, wherein the group III atoms of the periodic table are contained in the lower layer.

18. A photoconductive member according to claim 16, wherein the group V atoms of the periodic table are contained in the lower layer.

19. A photoconductive member according to claim 16, wherein at least one of oxygen atoms, carbon atoms and germanium atoms are contained in the lower layer.

20. A photoconductive member according to claim 19, wherein either the group III atoms or the group V atoms of the periodic table is further contained in the lower layer.

21. A photoconductive member according to claim 1, wherein an upper layer comprising silicon atoms as a matrix and at least one of carbon atoms, nitrogen atoms and oxygen atoms is further provided on the light receiving layer.

22. A photoconductive member according to claim 1, wherein an upper layer comprising a high dielectric organic material is further provided on the light receiving layer.

23. A photoconductive member according to claim 16, wherein an upper layer comprising silicon atoms as a matrix and at least one of carbon atoms, nitrogen atoms and oxygen atoms is further provided on the light receiving layer.

24. A photoconductive member according to claim 16, wherein an upper layer comprising a high dielectric organic material is further provided on the light receiving layer.

* * * * *